United States Patent [19]

Hsu

[11] Patent Number: 5,682,163
[45] Date of Patent: Oct. 28, 1997

[54] SEMI-PIPELINED ANALOG-TO-DIGITAL CONVERTER

[75] Inventor: Po-Chin Hsu, Taipei, Taiwan

[73] Assignee: Industrial Technology Research Institute, Hsinchu, Taiwan

[21] Appl. No.: 611,589

[22] Filed: Mar. 6, 1996

[51] Int. Cl.⁶ ............................................. H03M 1/12
[52] U.S. Cl. ................................. 341/156; 341/161
[58] Field of Search .................................. 341/156, 155, 341/163, 164, 161, 165, 159

[56] References Cited

U.S. PATENT DOCUMENTS

| | | | |
|---|---|---|---|
| 4,733,217 | 3/1988 | Dingwall | 340/347 |
| 4,903,028 | 2/1990 | Fukushima | 341/156 |
| 5,043,732 | 8/1991 | Robertson et al. | 341/156 |
| 5,223,836 | 6/1993 | Komatsu | 341/156 |
| 5,291,198 | 3/1994 | Dingwall et al. | 341/159 |
| 5,302,869 | 4/1994 | Hosotani et al. | 307/518 |
| 5,349,354 | 9/1994 | Ito et al. | 341/156 |
| 5,353,027 | 10/1994 | Vorenkamp et al. | 341/156 |
| 5,369,309 | 11/1994 | Bacrania et al. | 327/94 |
| 5,387,914 | 2/1995 | Mangelsdorf | 341/156 |
| 5,389,929 | 2/1995 | Nayebi et al. | 341/156 |
| 5,400,029 | 3/1995 | Kobayashi | 341/156 |
| 5,585,796 | 12/1996 | Svensson et al. | 341/155 |

*Primary Examiner*—Brian K. Young
*Attorney, Agent, or Firm*—George O. Saile

[57] ABSTRACT

A semi-pipelined analog-to-digital converter for the conversion of a continuous analog input signal to a series of digital output codes is disclosed. A semi-pipelined analog-to-digital converter has a coarse resolution analog-to-digital converter for the conversion of the analog input signal to a coarse digital code, and a fine analog-to-digital converter for the conversion of the analog input signal to a fine digital code. The digital output code of the semi-pipelined analog-to-digital converter is created by the encoding of the coarse and fine digital codes in an output encoder.

46 Claims, 10 Drawing Sheets

SEMI-PIPELINED ANALOG-TO-DIGITAL CONVERTER

BACKGROUND OF INVENTION

1. Field of the Invention

The present invention relates generally to Analog to Digital (A/D) converters and converting methods, and more particularly to multi-stage parallel type converters which use the first stage of conversion to determine the coarse range of the input voltage and a subsequent stages to resolve the analog input signal to finer increments. The present invention has applicability to video and digital signal processing.

2. Description of the Background Art

Figure 1A:
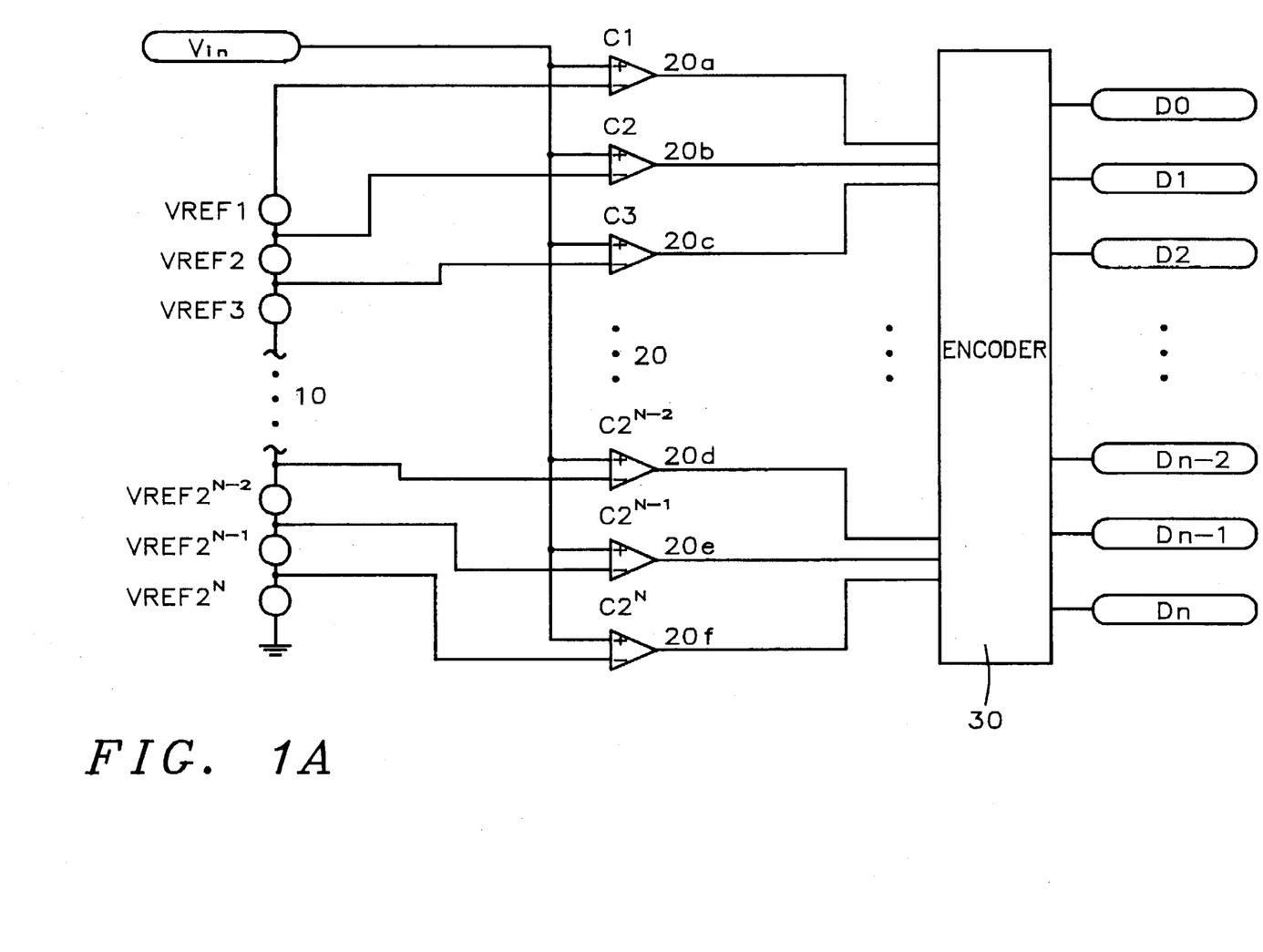
FIG. 1a is a schematic diagram of a parallel or Flash A/D converter of prior art.

The application of digital processing and transmission methods to analog information requires a technique for the conversion of signals from their analog form to a digital representation. Well known types of A/D converters include the parallel comparator type or FLASH converter, which compares multiple voltage references to the input voltage and outputs from the encoding logic the digital code representing the voltage reference closest to the input voltage in one operation and the Successive Approximation type which produces a digital output using a digital to analog (D/A) converter to create successive trial and error approximations of the input. FIG. 1a shows a representation of the FLASH type of A/D Converter. Typically the output is a binary code that is constructed in the Encoder Logic 30 thus providing an n bit resolution of the input signal. This structure typically requires $2^n$ voltage references 10 and $2^n$ comparators 20. As the resolution of this type of converter is improved (the number of output bits increases), the design becomes unwieldy.

Figure 1B:
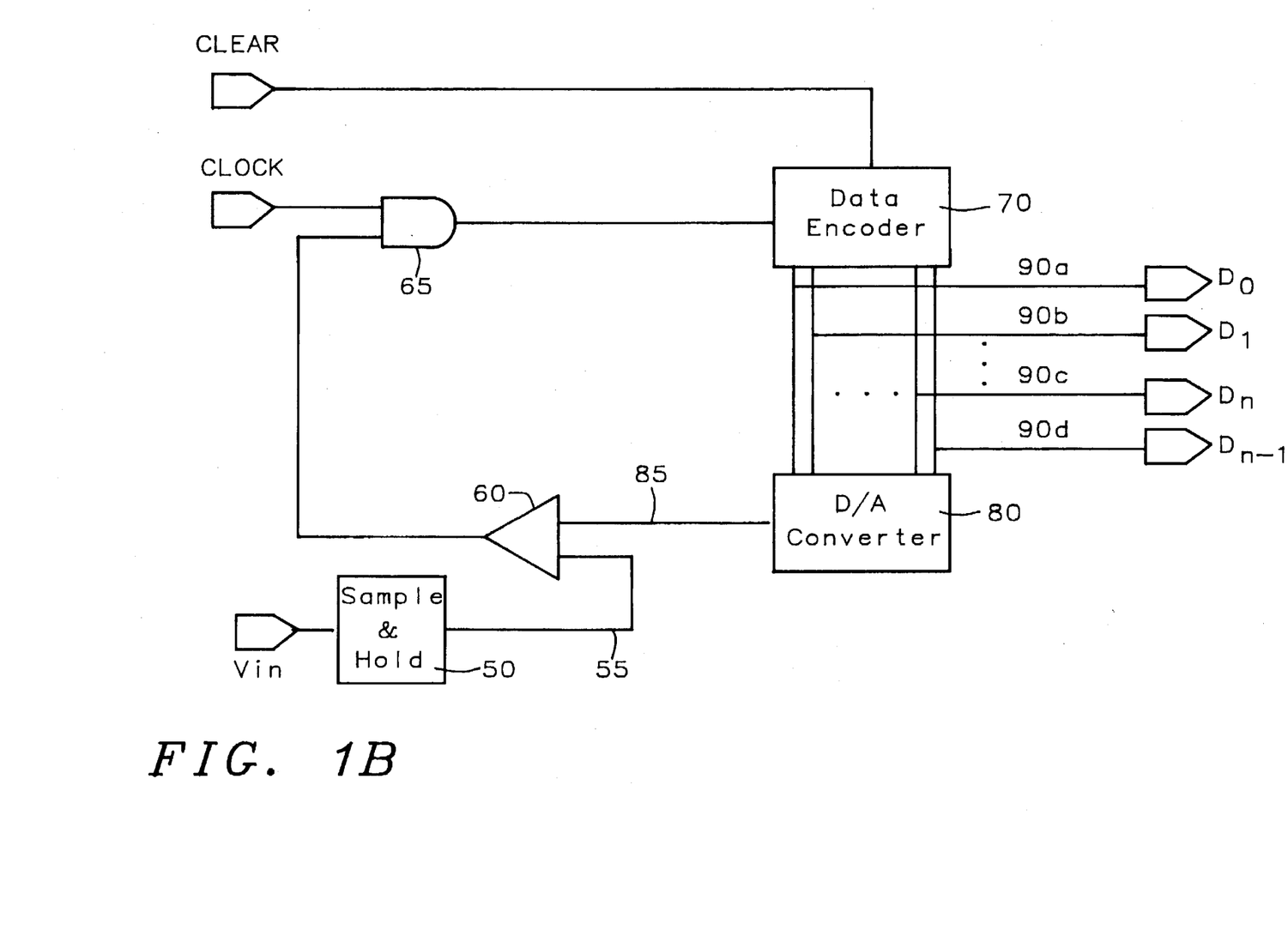
FIG. 1b is a schematic diagram of a successive approximation A/D converter of prior art.

FIG. 1b shows a representation of a successive approximation A/D converter. The analog input signal Vin is an input to a sample and hold circuit 50. The sampled analog input signal 55 is an input to a comparator 60. The data encoder 70 sets the most significant bit 90d of the data output word 90a . . . 90d to a logical "1" and all other bits 90a, 90b, 90c to a logical "0". The D/A converter 80 has an output 85 that is a voltage that is the midpoint of the voltage range of the D/A converter 80. If the voltage output 85 of the D/A converter 80 is greater than the sampled analog signal 55, the output of the comparator 60 becomes a zero and the clock is not gated through the AND gate 65. The data encoder 70 then sets the most significant bit 90d to a logical "0" and the next most significant bit 90c to a logical "1". The D/A converter 80 output 85 now has a voltage that is at ¼ of the voltage range of the D/A converter 80. The comparator 60 again compares the output of the D/A converter 85 to the sampled analog input signal 55. If the voltage of the output 85 of the D/A converter 80 is less than the sampled analog input signal, the comparator 60 will have a logical "1" as an output. The AND 65 will now pass the clock and the next most significant bit 90c will remain set at a logical "1" and the next least significant bit will be set to a logical "1".

This process of trial and setting of the output bits 90a, . . . , 90d will proceed until all the bits have been determined that represent the magnitude of sampled input signal. This process requires that the output bits 90a, . . . , 90d have to be examined by output circuitry only when the process has been completed. The successive approximation A/D converter requires separate sample and hold circuitry and a complex D/A converter subject to process errors.

In order to simplify the design of the FLASH A/D Converter, two techniques are known. In both techniques multiple stages of conversion are used accomplish the A/D conversion. In the first technique, as shown in U.S. Pat. No. 5,302,869 (Hosotani et al.), U.S. Pat. No. 5,389,929 (Nayebi et al), U.S. Pat. No. 5,353,027 (Vorenkamp et al.), U.S. Pat. No. 5,369,309 (Bacrania et al.), and U.S. Pat. No. 5,387 (Mangelsdorf), the first stage is a coarse resolution FLASH A/D conversion and the second stage, with a Digital to Analog Converter, adjusts the voltage references of the voltage comparators to form a fine resolution conversion. The results of the two conversions are encoded to form the digital output word representing the magnitude of the analog input voltage. In the second technique, as shown in U.S. Pat. No. 5,291,198 (Dingwall et al.), U.S. Pat. No. 5,223,836 (Komatsu), U.S. Pat. No. 5,400,029 (Kobayashi), U.S. Pat. No. 4,733 (Dingwall), U.S. Pat. No. 5,349,354 (Ho, et al.), and pending application Ser. No. 08/497881, assigned to the same assignee, and disclosure ERSO85-0009, also assigned to the same assignee, there will be multiple conversion stages with voltage references being appropriately switched to each stage by decision logic based on the results of the previous comparison stages.

Figure 2:
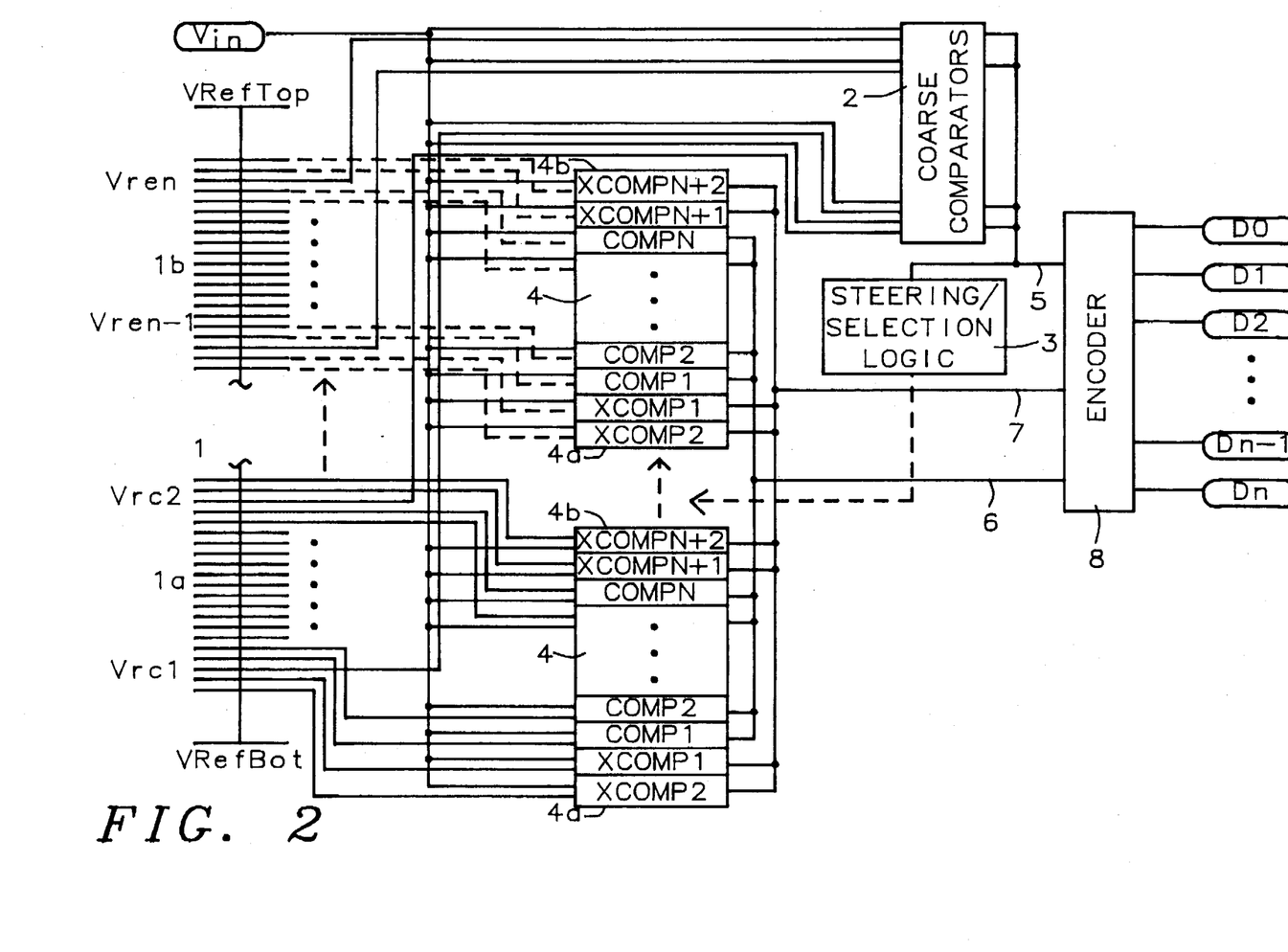
FIG. 2 is a functional block diagram of a two stage A/D converter of prior art.

As an example of the second techniques of multiple stage conversion, see in FIG. 2., which is a schematic diagram of U.S. Pat. No. 4,903,028 (Fukashima), that by creating a set of voltage sources 1 that have incrementally increasing values from $V_{REFBOT}$ (the lowest value) to $V_{REFTOP}$ (the highest value) establishes the range of conversion of the voltage input ($V_{in}$). A set of Coarse Subranging Comparators 2 are connected to the voltage input and to the set of voltage reference at discrete intervals establishing the course subranges 1a, 1b of $V_{in}$. The output of the Coarse Subrange Comparators 5 is the input to a Steering Logic and Switch Unit 3 that places a set of Fine Subrange Comparators 4 at the appropriate Subrange of the Voltage Reference Set 1. The set of Voltage References 1a are divided into fine increments establishing the maximum resolution of the conversion of $V_{in}$ to Digital Output {D0, D1, D2, . . . , Dn}. As $V_{in}$ changes the value of the output codes or the Coarse Subrange Comparators 5 change and the Steering Logic and Switch Unit 3 moves the Fine Subrange Comparators 4 to the next subrange (from 1a to 1b).

Due to the tolerances in component selection and process variation, the Output Codes 5 of the Coarse Subrange Comparators 2 may be in error. To detect this error, there will be Extra Fine Subrange Comparators 4a & 4b that will be placed above and below the subrange 1a or 1b determined by $V_{in}$. The output of the Extra Fine Comparators 4a & 4b form an error code 7. The output codes for Fine Subrange Comparators 6, the set of error codes 7, and the set of Coarse Subrange Codes 5 are interpreted by the Output Encoding Logic 8 to determine the output digital representation {D0, D1, D2, . . . , Dn}. of the voltage input $V_{in}$.

An important component of an A/D converter is the voltage comparator. The voltage comparator is well known in the art and consists of an operational amplifier that has one input connected to a reference voltage source and the other input to the analog voltage signal of interest. If the analog voltage signal is greater than the reference voltage source, then the output will assume a first logic state. However, if the analog voltage signal is less than the reference voltage source, the output will assume a second logic state.

Another type of comparator as described in pending application Ser. No. 08/405721, assigned to the same assignee, uses multiple amplifiers to form a bisection comparator to compare an analog voltage signal to a reference voltage.

SUMMARY OF THE INVENTION

An object of this invention is the reduction in size and complexity of the physical implementation of a parallel A/D converter. Another object of this invention is the reduction of power consumption by the elimination of excess circuitry such as D/A converters of successive approximation A/D converters and sample and hold circuitry. Furthermore still another object of this invention is the improvement of the settling time of the voltage reference generator of parallel A/D converters.

To accomplish these and other objects, a semi-pipelined A/D converter has a coarse A/D converter to convert an analog voltage signal to a coarse resolution digital code and a first and a second fine A/D converter to resolve the analog voltage signal to a fine resolution digital code. A coarse voltage reference generator develops a first plurality of reference voltages connected to the coarse A/D converter. A fine reference generator develops a second plurality of reference voltages connected to the first and second A/D converter.

Connected to the coarse reference generator is coarse reference voltage switching means to selectively couple one of the plurality of coarse reference voltages to the first and second fine A/D converter. The placement of the coarse reference voltage is dependent upon the value of the coarse digital code.

An output encoding means converts the coarse digital code and the first and second fine digital codes to the output digital code that represents the magnitude of the analog input voltage.

The fine digital code is created in the first fine A/D converter at a first conversion time and in the second fine A/D converter at a second conversion time. The first conversion time and the second conversion time are alternated repeatedly to form a series of output digital codes from a continuous analog voltage signal.

DETAILED DESCRIPTION OF THE INVENTION

Figure 3:
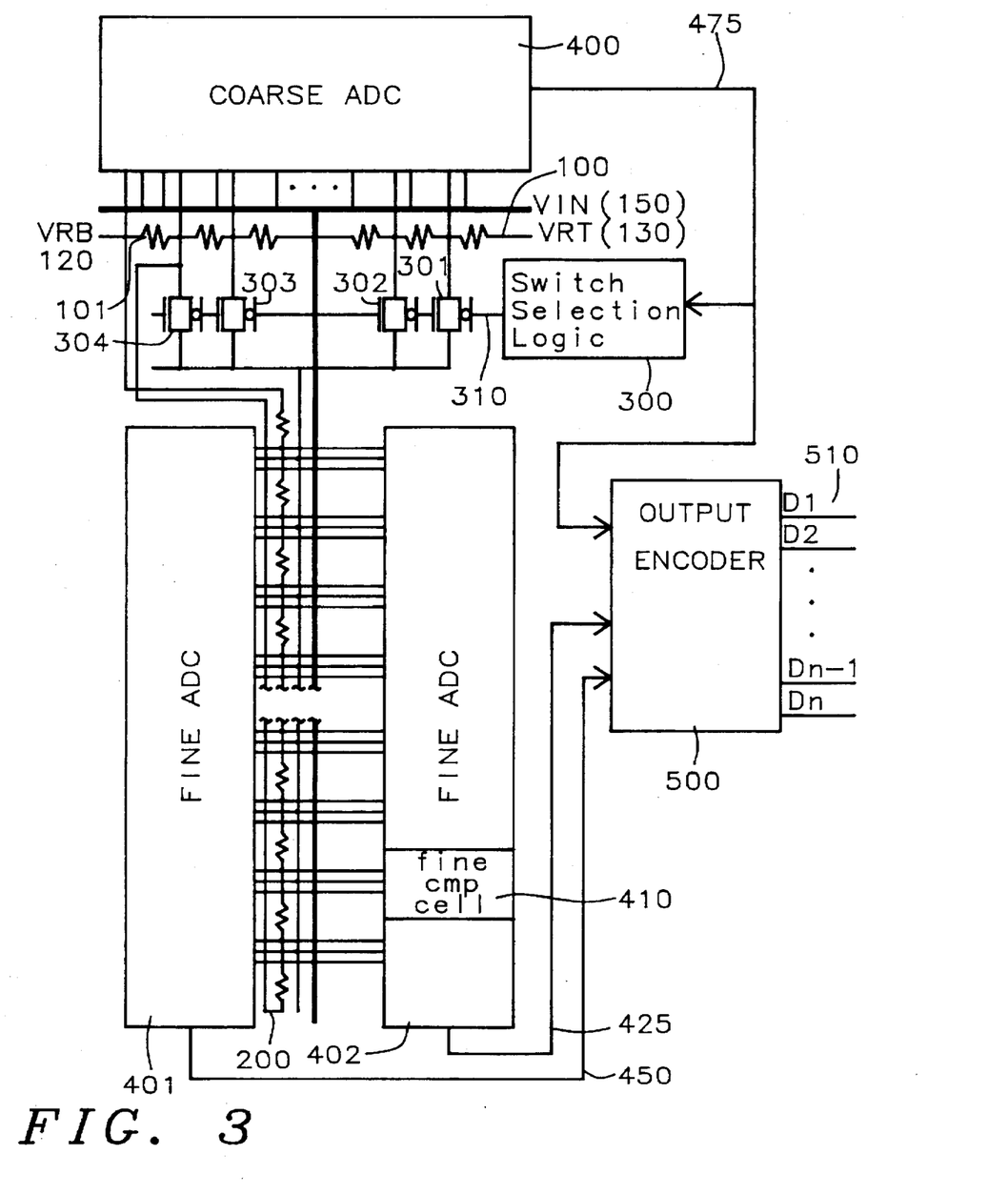
FIG. 3 is a functional block diagram of a semi-pipelined A/D converter of this invention.

Referring to FIG. 3, an analog input signal (Vin) 150 is applied to the coarse A/D converter 400 and to the fine A/D converters 401 and 402. The Vin 150 is sampled and held within the coarse A/D converter 400 and the fine A/D converters 401 and 402 at a first time increment. The sample of the Vin 150 is compared at a second time increment in the coarse A/D converter to the voltage generated from a resistor divider network which forms the coarse voltage reference generator 100. The resistor divider network is connected between voltage reference supplies Vrb 120 and Vrt 130. The results of the comparison of Vin 150 to the coarse reference generator 100 forms a thermometer code (a thermometer code is a binary code that is formed by each successive digit of the code changing to a "1" as the code increases, for example:

| | |
|---|---|
| 0000 | The lowest value of the code |
| 0001 | |
| 0011 | |
| 0111 | |
| 1111 | The highest value of the code) | that is the coarse digital code 475.

The coarse digital code 475 is passed to the switch selection logic 300 to select the reference voltage of coarse reference voltage generator 100 that is to be connected to the fine A/D converters 401 and 402. The switches 301, 302, 303, and 304 are activated to connect the appropriate reference voltage coarse reference generator 100 to the fine A/D converters 401 and 402.

The fine reference voltage reference generator 200 is another resistive divider network that is connected in parallel to one of the resistors for example the resistor 101 of the coarse voltage reference generator 100. Each reference voltage of the fine voltage reference generator 200 is connected to the fine A/D converters 401 and 402.

The analog input signal 150 is compared to the difference of selected coarse voltage reference 350 and the voltage of the fine voltage reference generator 200 at a third and fourth time increment. The results of the comparison forms a thermometer code that is the fine digital codes 425 and 450.

The coarse digital codes 475 and the fine digital codes 425 and 450 are converted in the output encoder 500 to the output digital code 510. The output digital code 510 is a binary number having a set of most significant bits that are determined from the course digital code 475, and a set of least significant bits that are determined from the fine digital codes 425 or 450. The output digital code 510 is created and held during a fifth and sixth increment of time.

A conversion cycle, which consists of the first through sixth increments of time, is repeated many times to form a series of output digital codes that represent the magnitude of the samples of the Vin 150. On one conversion cycle, the fine A/D converter 401 create the fine digital code 425. On an alternate conversion cycle, the fine A/D converter 402 creates the fine digital code 450. The alternating of the fine A/D converters 401 and 402 allows the sampling of the next conversion cycles to start while the prior conversion cycle is being processed. This allows the sampling to proceed at a rate twice that of having only one fine A/D converter.

Figure 4A:
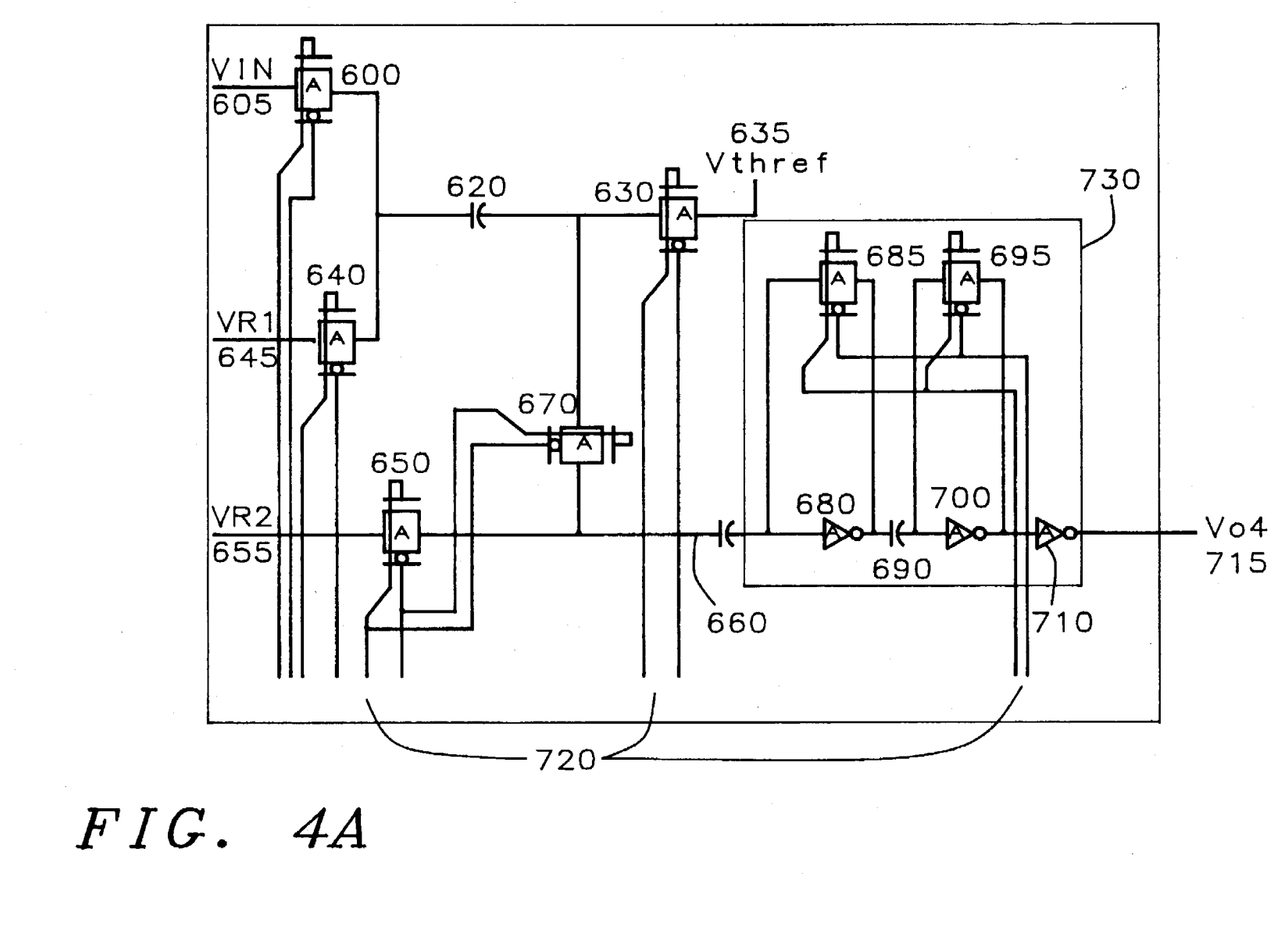
FIGS. 4a and 4b are schematic diagrams of voltage comparators of this invention.
Figure 4B:
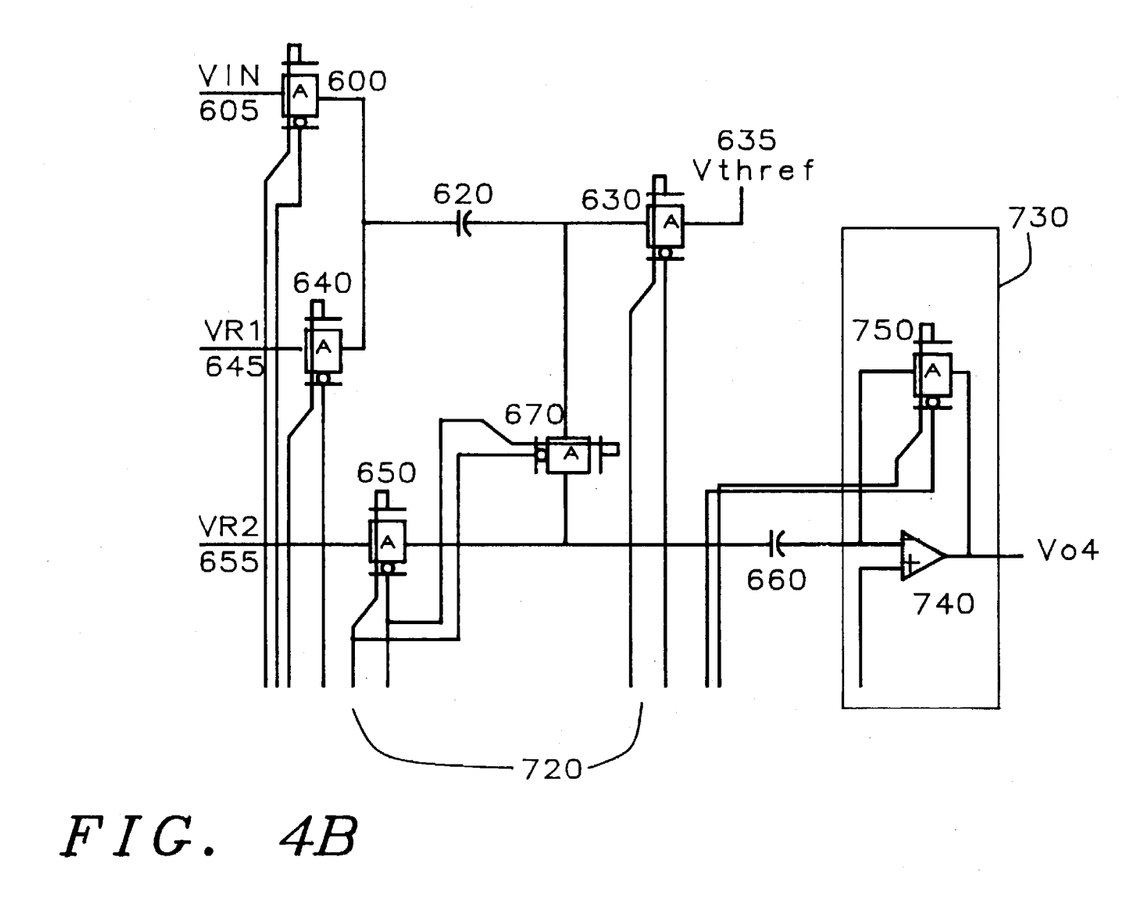

Each fine A/D converter 401 and 402 is formed by a plurality of comparator cells 410. FIGS. 4a and 4b each show a schematic drawing of the comparator cell. The analog input voltage Vin is connected to a first terminal of a metal oxide semiconductor field effect transistor (MOSFET) switch 600. The voltage (Vr1) 645, which is the selected coarse reference voltage (350 of FIG. 3), is connected to the first terminal of MOSFET Switch 640. The voltage (Vr2) 655, which is one of the voltages of the fine voltage reference generator (200 of FIG. 3), is connected to the first terminal of MOSFET switch 650. The threshold voltage reference 635 is connected to the first terminal of MOSFET switch 630. The capacitor 620 is connected between the second terminals of MOSFET switches 600, 640, and the second terminal of MOSFET switch 630. MOSFET switch 670 is connected between the second terminal of MOSFET switch 630 and the second terminal of MOSFET switch 650. The first terminal of capacitor 660 is connected to the second terminals of MOSFET switches 650 and 670. The second terminal of capacitor 660 is connected to the input terminal of amplifier 730. The output of amplifier 730 is the output of the comparator circuit $V_o$ 715 and is a single bit that will form the fine digital code (425 and 450 of FIG. 3).

The amplifier 730 may be implemented as is required by the application. In FIG. 4a, the input of the amplifier 730 is connected to the first terminal of MOSFET switch 685 and the input terminal of amplifier 680. The second terminal of MOSFET switch 685 and the output terminal of the amplifier 680 are connected to the first terminal of capacitor 690. The second terminal of capacitor 690 is connected to the first terminal of MOSFET switch 695 and the input terminal of amplifier 700. The second terminal of MOSFET switch 695 and the output terminal of amplifier 700 are connected to the input terminal of latching amplifier 710. The output terminal of latching amplifier 710 is the output of amplifier 730.

FIG. 4a shows three inverters 680, 700, and 710. Each inverter stage acts as an amplifier and the number of inverter stages can be varied with the application.

FIG. 4b shows an alternate design for the amplifier 730, wherein the input of the amplifier 730 is the first terminal of MOSFET 750 and the negative terminal of operational amplifier 740. The positive terminal of operational amplifier 740 is connected to a voltage reference V_reference, thus configuring the operational amplifier 740 as a voltage comparator. The second terminal of MOSFET 750 and the output of the operational amplifier 740 are connected to form the output of amplifier 730.

The MOSFET switches 600, 630 640, 650, 670, 685, 695 and 750 are controlled by the control timing signals 720.

Figure 5A:
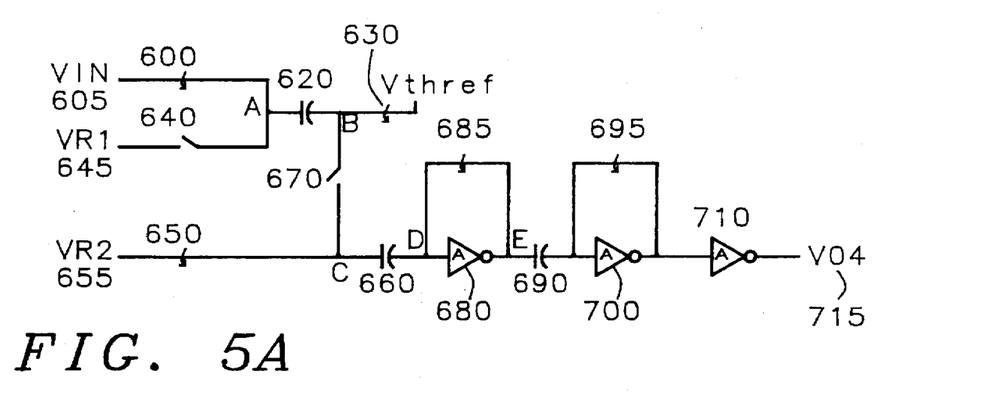
FIGS. 5a–5d are schematic diagrams of the comparator of this invention showing the operating conditions during the process of the A/D conversion.

The operation modes of the comparator shown in FIG. 4 are shown in FIGS. 5a–5d. FIG. 5a shows the comparator during the first increment of time wherein the sampling of the Vin 605 takes place. MOSFET switches 600, 630, 650, 685, and 695 are activated and MOSFET switch 640 and 670 are deactivated. The voltage developed across capacitor 620 is Vin–Vthref. The voltage developed across the capacitor 660 is Vr2–Vth2 (where Vth2 is the self-biasing voltage of amplifier 680). The amplifier 700 is also biased at its self-biasing voltage.

Figure 5B:
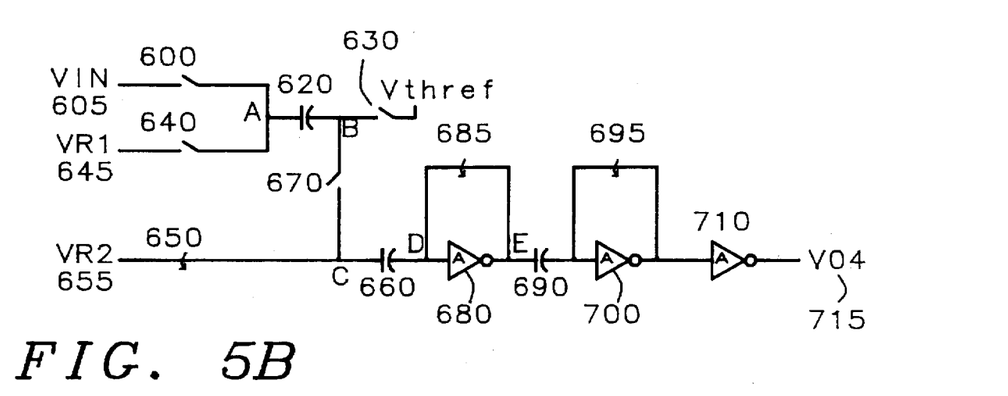

FIG. 5b shows the operation of the comparator at the second increment of time. The MOSFET switches 600 are deactivated so that the voltage developed across the capacitor 620 is held constant, thus retaining a sample of the Vin 605. At this operation, the switch 630 can be either at an on or off status, since it will not effect the voltage held across the capacitor 620.

Figure 5C:
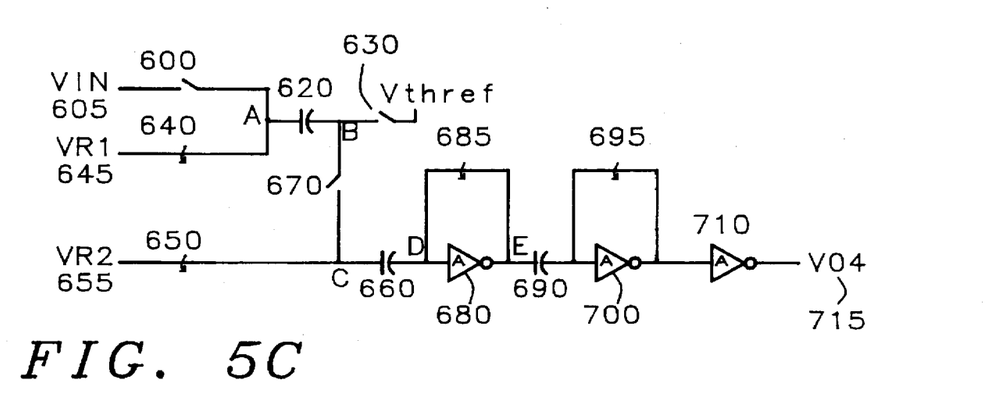
Figure 5D:
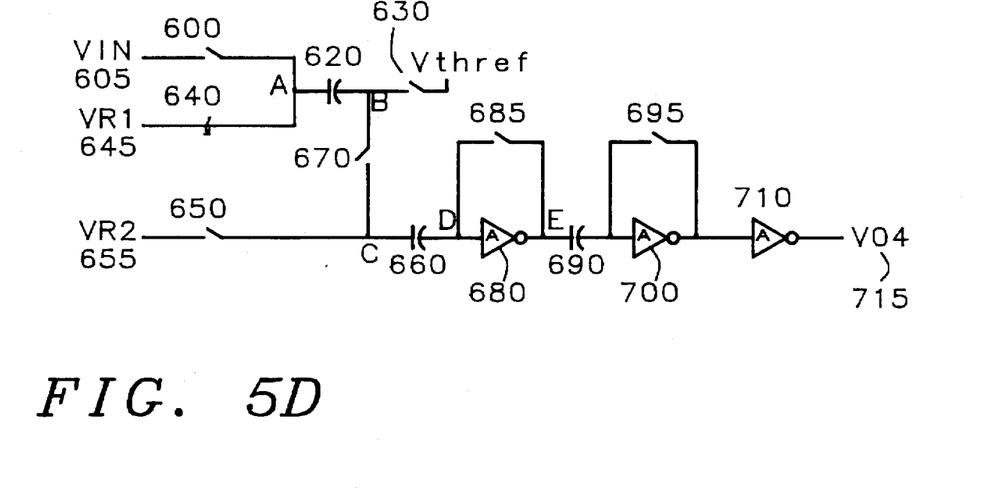

FIG. 5c shows the operation of the comparator at the third increment of time. MOSFET switch 640 is activated to connect Vr1 645 to the point A which is the first terminal of the capacitor 620. The voltage that is present at point B (the second terminal of the capacitor 620) now becomes Vthref+(Vr1–Vin). The value of Vr1 645 is the selected coarse reference voltage (350 of FIG. 3). The operation of the comparator during the fourth increment of time is shown in FIG. 5d. MOSFET switch 640 remains activated and MOSFET switches 600, 630, 650, 685, and 695 are deactivated. The activation of MOSFET switch 670 connects the second terminal of capacitor 620 to the first terminal of capacitor 660. This connection makes the voltage developed at point D, the input to amplifier 680, (Vth2+(Vthref+(Vr1–Vin))–Vr2)

Vr2 is set to equal Vthref+k*LSB (where k*LSB is the finest voltage to be compared), thus making the above equation Vth2+(Vr1–Vin–k*LSB).

And since the input terminals of amplifiers 680 and 700 are set to their self-biasing levels, only the value Vr1–Vin–k*LSB will be amplified. The latching amplifier 710 will place a logical "1" on the Vo4 715 if:

Vin<Vr1–k*LSB and a logical "0" if:

Vin>Vr1–k*LSB.

Figure 6:
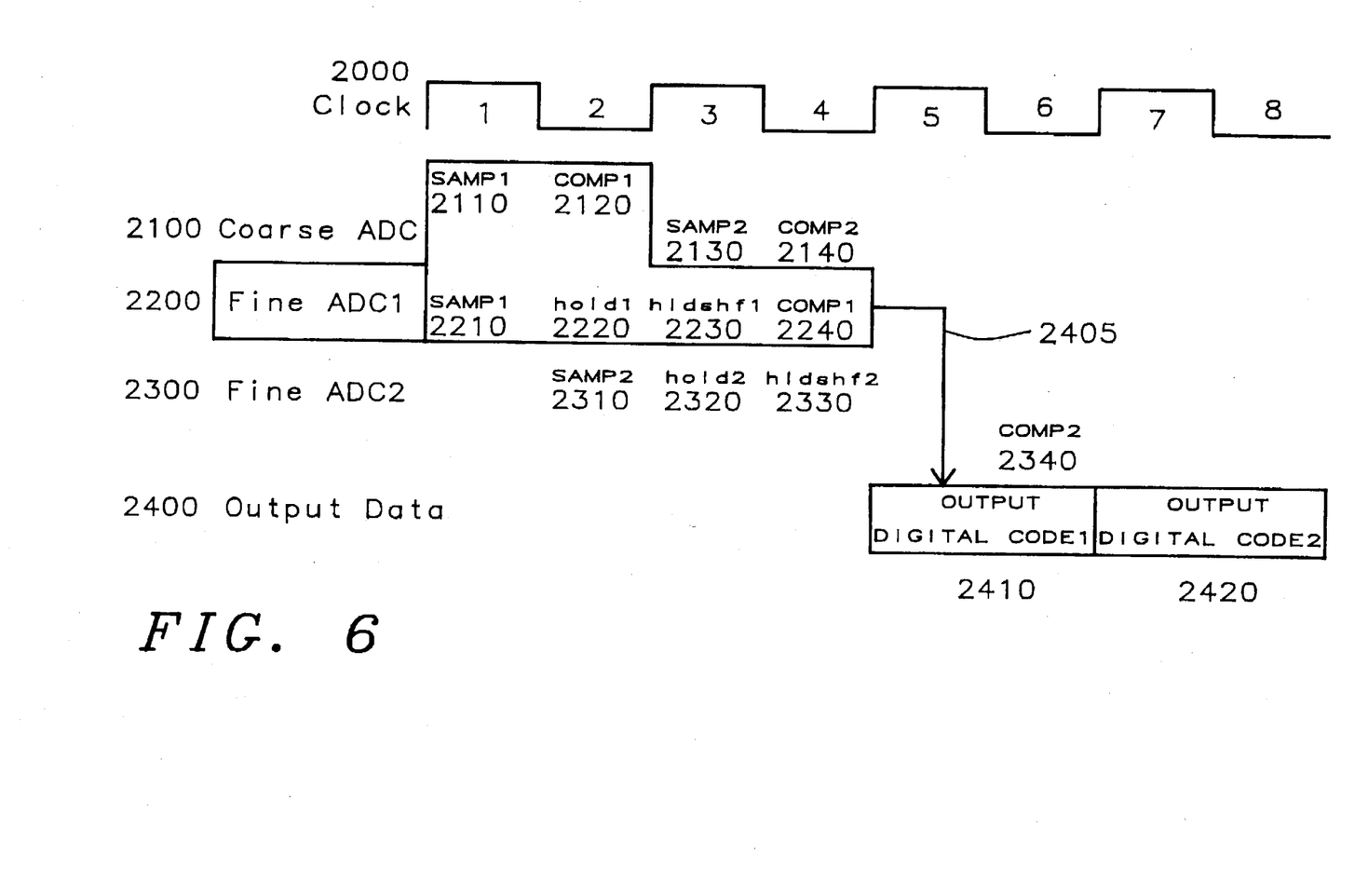
FIG. 6 is a timing diagram showing the timing of the steps of the method of the A/D conversion of this invention.

The timing diagram of FIG. 6 illustrates the method of the semi-pipelined A/D conversion. At the first time increment of the clock 2000, the analog input signal is sampled 2110 by the coarse A/D converter 2100 and is sampled 2210 by the first fine A/D converter 2200. At the second time increment of the clock 2000, the sampled analog input signal is compared 2120 by the coarse A/D converter 2100 to the coarse reference voltages. The sampled analog input voltage is held 2220, while the appropriate coarse reference voltage is selected to be connected to the first fine A/D converter 2200. At the third time increment of the clock 2200, the appropriate coarse reference voltage is connected to the first fine A/D converter 2200, to shift the voltage as described in FIG. 5c. The sampled and shifted analog input signal is compared 2240 during the fourth time increment of the clock 2000. The results of the coarse and fine comparisons 2405 are transferred to the output encoder to be translated to an output digital code 1 2410 during the fifth time increment of the clock 2000 into the data output 2400. The output digital code 1 2410 is held valid during the sixth time increment of the clock 2000.

A second comparison cycle starts during the third increment of the clock 2000 with sampling 2130 of the analog input signal into the coarse A/D converter 2100 and the sampling 2310 of the analog input signal into the second fine A/D converter 2300 The second coarse comparison 2140 and the second holding 2320 at the second A/D converter 2300 occurs during the fourth time increment of the clock 2000. The second hold-shift 2330 occurs during the fifth time increment of the clock 2000. The coarse digital data and the fine digital data of the second conversion are translated output digital code 2 2420 and placed on the data output 2400 during the seventh time increment and held valid during the eighth time increment of the clock 2000.

Figure 7:
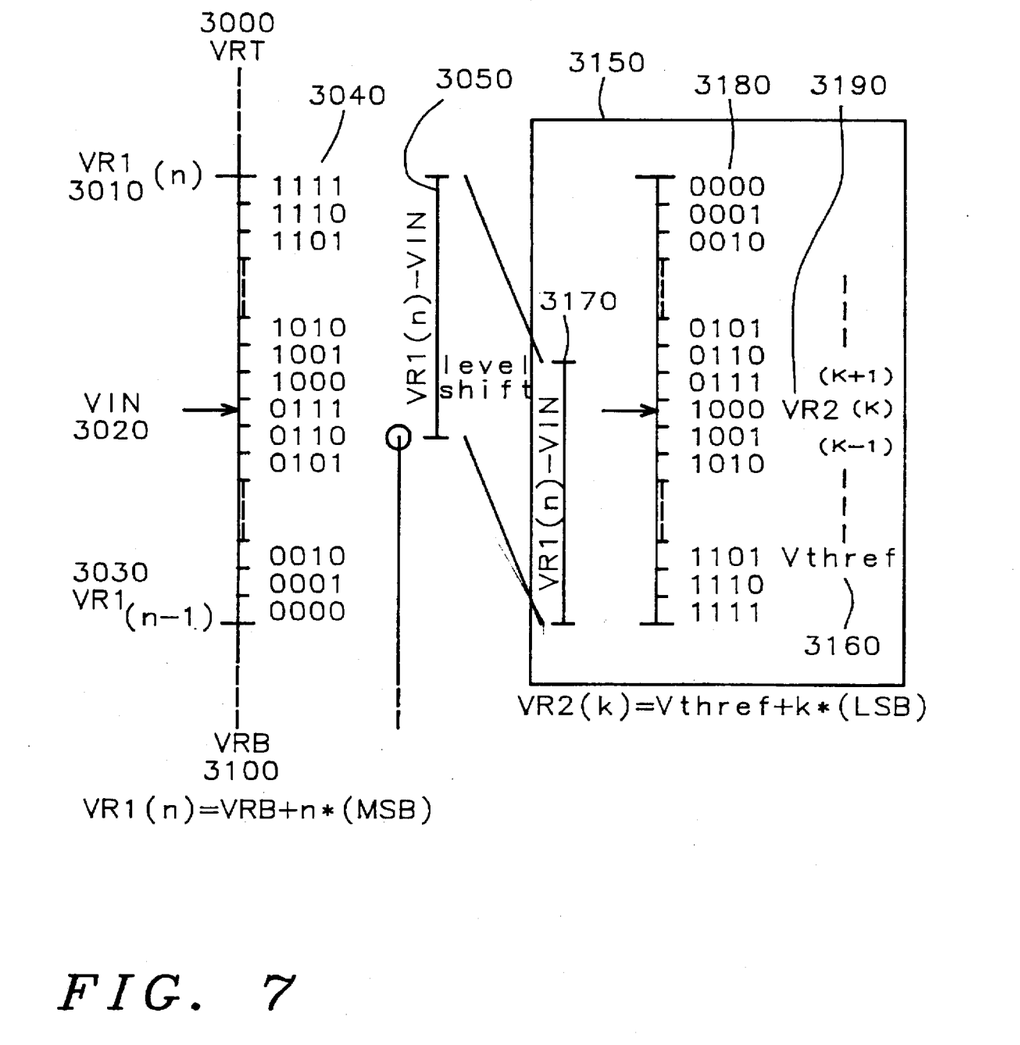
FIG. 7 is a diagram of the resolution of the fine digital codes of this invention.

The method for deriving the code for the least significant bits is shown in FIG. 7. The coarse voltage reference generator (100 of FIG. 3) can be viewed as spanning from Vrt 3000 to Vrb 3100 with the increments Vr1(n) 3010 and Vr1(n−1) 3030 each being one of the voltage references. The fine A/D converter (401 and 402 of FIG. 3) divide the coarse increment into fine increments 3040.

If an analog input signal (Vin) 3020 is at a point between Vr1(n) 3010 and Vr1(n−1) 3030, the coarse A/D converter (400 of FIG. 3) will have a "0" for the comparator that has Vr1(n) as a reference and a "1" for the comparator that has Vr1(n−1) as a reference. The switch selection logic (300 of FIG. 3) will connect Vr1(n) to the fine A/D converters (401 and 402 of FIG. 3). The fine A/D converters (401 and 402 of FIG. 3) will derive a voltage that is Vr1(n)−Vin 3050 and shift this voltage to the fine comparator range 3150. The magnitude of voltage 3170 will be based from the Vthref 3160. The reference Vr2(k) 3190 will be derived from the fine voltage reference generator (200 of FIG. 3). The codes 3180 that are available will be derived in the output encoder (500 of FIG. 3).

While the invention has been particularly shown and described with reference to the preferred embodiments thereof, it will be understood by those skilled in the art that various changes in form and details may be made without departing from the spirit and scope of the invention.

What is claimed is:

1. A semi-pipelined analog-to-digital converter to convert a continuous analog input signal to a series of first and second digital output codes, comprising:

a) a coarse analog-to-digital converter to convert the analog input signal to a coarse digital code;

b) a coarse voltage reference generator to generate a first plurality of reference voltages;

c) a fine voltage reference generator to generate a second plurality of reference voltages;

d) a first fine analog-to-digital converter to convert the analog input signal to a first fine digital code at a first conversion time;

e) a second fine analog-to-digital converter to convert the analog input signal to a second digital code at a second conversion time;

f) a coarse range selection switching means to selectively couple one of the first plurality of reference voltages to the first and second fine analog-to-digital converters; and g) an output encoding means to encode the coarse digital code and the first fine digital code to the first digital output code at the first conversion time, and to encode the coarse digital code and the second fine digital code to the second digital output code at the second conversion time.

2. The converter of claim 1 wherein the first conversion time and the second conversion time will alternate overtime.

3. The converter of claim 1 wherein each output code of the series of output codes is a binary number comprising a plurality of most significant bits and a plurality of least significant bits.

4. The converter of claim 3 wherein the coarse digital code determines the most significant bits.

5. The converter of claim 1 wherein the first and second fine digital codes determine the least significant bits.

6. The converter of claim 1 wherein the coarse voltage reference generator comprises:

a) a first reference voltage source;

b) a first resistor coupled to the first reference voltage source;

c) a second reference voltage source;

d) a last resistor coupled to the second reference voltage source; and e) a first plurality of series connected resistors coupled between the first resistor and the last resistor.

7. The converter of claim 6 wherein the first resistor, the first plurality of series connected resistors, and the last resistor have a voltage present at each connection of the first plurality of series connected resistors.

8. The converter of claim 7 wherein each voltage present at each connection of the first plurality of series connected resistors is one of the first plurality of reference voltages.

9. The converter of claim 1 wherein the fine voltage reference generator is connected between the connection of the last resistor and the plurality of series connected resistors and the second reference voltage source, in parallel with one resistor of the plurality of series connected resistors.

10. The converter of claim 1 wherein the fine voltage reference generator comprises a second plurality of series connected resistors.

11. The converter of claim 10 wherein each connection of the second plurality of series connected resistors has a voltage present that is one of the second plurality of voltage references.

12. The converter of claim 1 wherein each of the first and second fine analog-to-digital converter comprises:

a) a plurality of voltage comparators, wherein each comparator comprises a compare input terminal coupled to the analog input signal, a first reference terminal coupled to one of the first plurality of reference voltages, a second reference terminal coupled to one of the second plurality of reference voltages, a compare output terminal where a compare output signal is placed, and a voltage comparator means that will generate a compare output signal; and b) an encoding means to translate the compare output signals from a the plurality of voltage comparators to the fine digital code.

13. The converter of claim 12 wherein the compare output signal has a first state if the compare input terminal has a voltage that is greater than the difference of the voltages at the first and second reference terminals, and a second state if the compare input terminal has a voltage that is less than the difference of said voltages at the first and second reference terminals.

14. The converter of claim 1 wherein the first conversion time and the second conversion time are alternately repeated to perform the conversion of the continuous analog input signal to the series of digital output codes.

15. A voltage comparison means to compare an analog input signal to a first reference voltage and a second reference voltage and provide an output compare signal, comprising:

a) an input terminal coupled to the analog input signal;

b) a first reference terminal coupled to the first reference voltage;

c) a second reference terminal coupled to the second reference voltage;

d) a threshold voltage source;

e) a first capacitor comprising a first plate and second plate;

f) a first switch to selectively couple the input terminal to the first plate of the first capacitor;

g) a second switch to selectively couple the first reference terminal to the first plate of the first capacitor;

h) a third switch to selectively couple the threshold voltage source to the second plate of the first capacitor;

i) a second capacitor comprising a first plate and a second plate;

j) a fourth switch to selectively couple the second reference terminal to the first plate of the second capacitor;

k) a fifth switch to selectively couple the second plate of the first capacitor to the first plate of the second capacitor;

l) a amplifier means, comprising a amplifier input terminal, a amplifier output terminal, a amplification means to amplify a signal that is placed on the amplifier input terminal and place said amplified signal on the amplifier output terminal; and m) a compare output terminal coupled to the amplifier output terminal to provide the output compare signal.

16. The comparison means of claim 15 wherein at a sample time the first switch is activated to couple the analog input signal to the first plate of the first capacitor and the third switch is activated to couple the threshold voltage source to the second plate of the first capacitor.

17. The comparison means of claim 16 wherein a voltage between the first and second plates of the first capacitor is the difference between the analog input signal and the threshold voltage source.

18. The comparison means of claim 15 wherein at the sample time, the fourth switch is activated to couple the second reference voltage to the first plate of the second capacitor.

19. The comparison means of claim 18 wherein at the sample time, a voltage that is developed between the first and second plates of the second capacitor is the difference of the second reference voltage and a self-biasing voltage of the first amplifier.

20. The comparison means of claim 15 wherein at the sample time the second switch and the fourth switch are not activated for coupling.

21. The comparison means of claim 15 wherein at a hold time, which follows the sample time, the first switch is deactivated to uncouple the analog input signal from the first plate of the first capacitor.

22. The comparison means of claim 15 wherein at the hold time, the third switch is deactivated to uncouple the threshold voltage source from the second plate of the first capacitor.

23. The comparison means of claim 15 wherein at the hold time, the second switch and the fourth switch remain not activated for coupling.

24. The comparison means of claim 15 wherein at the hold time, the fifth switch, the sixth switch, and the seventh switch remain activated for coupling.

25. The comparison means of claim 15 wherein at a hold-shift time, which follows the hold time, the second switch is activated to couple the first reference voltage to the first plate of the first capacitor.

26. The comparison means of claim 25 wherein at the hold-shift time, a voltage developed at the second plate of the first capacitor is now the magnitude of the threshold voltage source added to a difference in the magnitude of the first reference voltage and the magnitude of the analog input signal and the magnitude of the threshold voltage source.

27. The comparison means of claim 15 wherein at the hold-shift time, the first, third and fourth switches remain not activated for coupling.

28. The comparison means of claim 15 wherein at a compare time, which follows the hold-shift time, the fifth switch becomes deactivated for coupling.

29. The comparison means of claim 15 wherein at the compare time, the fourth switch is activated to couple the second plate of the first capacitor to the first plate of the second capacitor.

30. The comparison means of claim 15 wherein a voltage developed at the amplifier input terminal is magnitude of the self-biasing voltage of the amplifier means added to the magnitude of the threshold voltage source, which is added to the difference of the magnitude of the first reference voltage and the magnitude of the analog input signal, from which the magnitude of the second voltage reference is subtracted.

31. The comparison means of claim 30 wherein the magnitude of the second voltage reference is equal to the magnitude of the threshold voltage source added to a compare voltage which is the smallest increment of voltage from the first voltage source.

32. The comparison means of claim 31 wherein the latching amplifier means has a first state if the magnitude of the analog input signal is greater than the difference of the first reference voltage and the compare voltage, and a second state if the magnitude of the analog input signal is less than the difference of the magnitudes of the first reference voltage and the compare voltage.

33. A method for the semi-pipelined conversion of a continuous analog input signal to a series of digital output codes representing a magnitude of the said continuous analog input signal, comprising the steps of:

a) sampling of the continuous analog input signal at a first time into a first sample and a second sample;

b) comparing of the first sample to a plurality of coarse voltage references to form a coarse thermometer code at a second time;

c) while simultaneously holding the second sample;

d) selecting and shifting of the plurality of coarse reference voltages during a third time;

e) comparing of the second sample to a difference of one of the plurality of coarse voltage references and a plurality of fine voltage references to form a fine thermometer code at a fourth time;

f) encoding of the coarse and fine thermometer codes to form one of the digital output codes; and g) continuously repeating the aforementioned steps to form the series of digital output codes.

34. The method of claim 33 wherein each digital output code of the series of digital output codes is a binary number comprising a plurality of most significant bits and a plurality of least significant bits.

35. The method of claim 33 wherein the coarse thermometer code determines the most significant bits.

36. The method of claim 33 wherein the first and second fine thermometer codes determine the least significant bits.

37. The method of claim 33 wherein the coarse voltage references are created by a coarse reference voltage generator which comprises:

a) a first reference voltage source;

b) a first resistor coupled to the first reference voltage source;

c) a second reference voltage source;

d) a last resistor couple to the second reference voltage source; and e) a first plurality of series connected resistors coupled between the first resistor and the last resistor.

38. The method of claim 37 wherein the first resistor, the first plurality of series connected resistors, and the last resistor have a voltage present at each connection of the first plurality of series connected resistors.

39. The method of claim 38 wherein each voltage present at each connection of the first plurality of series connected resistors is one of the coarse reference voltages.

40. The method of claim 37 wherein the plurality of fine reference voltages are created by a fine voltage reference generator that is connected between the connection of the last resistor and the plurality of series connected resistors and the second reference voltage source, in parallel with the one resistor of the plurality of series connected resistors.

41. The method of claim 33 wherein the fine voltage reference generator comprises a second plurality of series connected resistors.

42. The method of claim 41 wherein each connection of the second plurality of series connected resistors has a voltage present that is one of fine reference voltages.

43. The method of claim 33 wherein the comparing of the first sample is accomplished in a first analog-to-digital converter.

44. The method of claim 33 wherein the comparing of the second sample is accomplished in an second analog-to-digital converter which comprises:

a) a plurality of voltage comparators, wherein each comparator comprises a compare input terminal coupled to the analog input signal, a first reference terminal coupled to one of the first plurality of reference voltages, a second reference terminal coupled to one of the second plurality of reference voltages, a compare output terminal where a compare output signal is placed, and a voltage comparator means that will generate a compare output signal;

b) an encoding means to translate the compare output signals from a the plurality of voltage comparators to the fine digital code.

45. The method of claim 44 wherein the output signals has a first state if the compare input terminal has a voltage that is greater than the difference of the voltages at the first and second reference terminals, and a second state if the compare input terminal has a voltage that is less than the difference of said voltages at the first and second reference terminals.

46. The method of claim 33 wherein the repeating may begin prior to the completion of the steps of said method.

* * * * *